(12) United States Patent
Igarashi

(10) Patent No.: US 8,115,562 B2
(45) Date of Patent: Feb. 14, 2012

(54) OSCILLATION CIRCUIT AND METHOD OF CONTROLLING SAME

(75) Inventor: Hatsuhide Igarashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 39 days.

(21) Appl. No.: 12/585,824

(22) Filed: Sep. 25, 2009

(65) Prior Publication Data

US 2010/0079213 A1    Apr. 1, 2010

(30) Foreign Application Priority Data

Sep. 29, 2008  (JP) ................................. 2008-251169

(51) Int. Cl.
*H03B 5/36* (2006.01)
(52) U.S. Cl. ............... 331/116 R; 331/116 FE; 331/154; 331/155; 331/158; 331/173
(58) Field of Classification Search .............. 331/116 R, 331/116 FE, 154, 155, 158, 173
See application file for complete search history.

(56) References Cited

U.S. PATENT DOCUMENTS

| | | | | |
|---|---|---|---|---|
| 4,376,918 A | * | 3/1983 | Masuda et al. | 331/116 FE |
| 5,982,246 A | * | 11/1999 | Hofhine et al. | 331/116 FE |
| 7,109,813 B2 | * | 9/2006 | Pan | 331/158 |
| 2006/0071725 A1 | * | 4/2006 | Nunokawa et al. | 331/74 |

FOREIGN PATENT DOCUMENTS

| | | |
|---|---|---|
| JP | 59-205802 | 11/1984 |
| JP | 7-193427 | 7/1995 |
| JP | 11-308051 | 11/1999 |

* cited by examiner

*Primary Examiner* — Arnold Kinkead
*Assistant Examiner* — Richard Tan
(74) *Attorney, Agent, or Firm* — McGinn IP Law Group, PLLC

(57) ABSTRACT

Disclosed is an oscillator in which current consumption relating to oscillation is reduced. The oscillator comprises: an amplifier to an input and output of which a piezoelectric oscillator and a feedback resistor are connected in parallel, and which is constituted by a CMOS logic inverter circuit; and a control circuit, which is constituted by a CMOS logic circuit, for clamping input/output levels of the amplifier and halting oscillation before oscillation start-up, unclamping the input/output levels at beginning of oscillation start-up and supplying a pulse signal to an output terminal of the amplifier a prescribed period of time after the beginning of oscillation start-up.

20 Claims, 9 Drawing Sheets

OSCILLATION CIRCUIT AND METHOD OF CONTROLLING SAME

REFERENCE TO RELATED APPLICATION

This application is based upon and claims the benefit of the priority of Japanese patent application No. 2008-251169, filed on Sep. 29, 2008, the disclosure of which is incorporated herein in its entirety by reference thereto.

TECHNICAL FIELD

This invention relates to an oscillation circuit and to a method of controlling the oscillation circuit. More particularly, the invention relates to an oscillation circuit constituted by a CMOS circuit and to a method of controlling the oscillation circuit.

BACKGROUND

Circuits in which a piezoelectric oscillator such as a crystal oscillator and a feedback resistance element are connected in parallel across the input and output of a CMOS inverter are in widespread use as oscillation circuits used as a source for generating a reference clock. Patent Document 1 discloses a technique for suppressing needless consumption of current in such an oscillation circuit when oscillation stops. In the oscillation circuit of Patent Document 1, a feedback resistor is constituted by a MOS transistor, a series circuit in which a second feedback resistor having a resistance value lower than that of the MOS transistor and a capacitance element are serially connected is connected in parallel with the MOS transistor, and a control circuit is provided for holding the input or output terminal of a CMOS inverter at a desired potential by a signal for halting oscillation. The oscillation circuit operates in such a manner that the MOS transistor is turned off by the oscillation-halt signal.

On the other hand, Patent Document 2 describes an oscillation circuit the object of which is to hasten oscillation start-up. The oscillation circuit is provided with a trigger circuit for generating a trigger upon detecting the rising edge of power supply voltage on the input or output side of an amplifier. Oscillation is started by supplying a trigger pulse to the oscillation circuit by the trigger circuit.

As related art, Patent Document 3 describes an oscillation circuit the object of which is to facilitate normal oscillation. The oscillation circuit comprises a vibrator connected in parallel with a feedback resistor externally of the oscillation circuit; and an oscillation starting circuit forming an oscillator connected to one terminal of the vibrator and packaged together with the vibrator, and being rendered conductive by an external signal to thereby ground the terminal and start oscillation of an amplifier equipped with a feedback resistor.

[Patent Document 1]
JP Patent Kokai Publication No. JP-A7-193427
[Patent Document 2]
JP Patent Kokai Publication No. JP-A59-205802
[Patent Document 3]
JP Patent Kokai Publication No. JP-A11-308051

SUMMARY

The disclosure of the above Patent Documents are incorporated herein by reference thereto. Now, the following analyses are given by the present invention.

By way of example, a portable electronic device such as an electronic key for an automobile is equipped with a battery and an oscillation circuit supplied with power by the battery. A prescribed circuit that is operated by the oscillation signal produced by the oscillation circuit is provided so that a prescribed code signal can be transmitted. When the prescribed circuit is in a standby mode, a state in which power is constantly supplied by the battery is attained. Operation is such that the power supply current flows only when the prescribed circuit operates, as a result of which low current consumption is achieved. The same is true for the oscillation circuit. The oscillation circuit of Patent Document 1 is ideal as an oscillation circuit that operates in this standby mode.

In the case of an electronic key or the like, the code relating to the key is simple and the time needed to transmit the code signal is very short. For example, one millisecond is enough time for transmitting tens of bytes. By contrast, a much longer time is needed to start up the oscillation circuit in order to send the code signal, start oscillation and supply the prescribed circuit with a steady-state oscillation signal. In such case most consumption of the battery occurs in the time needed for starting up the oscillation circuit. Although the oscillation circuit of Patent Document 1 suppresses wasteful current consumption when oscillation ceases, it cannot suppress current consumption related to start-up of the oscillation circuit.

In accordance with the description rendered in Patent Document 2, it is indicated that in a case where the oscillation frequency is several megahertz, it takes several milliseconds to ten and several milliseconds for the oscillation waveform to attain a practically problem-free size after power is introduced. Further, in accordance with the present inventor, it has been confirmed that the time needed is several hundred microseconds to several milliseconds in a case where the oscillation frequency is 10 MHz.

On the other hand, in accordance with the oscillation circuit described in Patent Document 2, start-up can be hastened several-fold by supplying the trigger signal to the input terminal. However, once the input terminal has been grounded by the trigger pulse, approximately $3\tau$ (100 µs) is required. That is, if the capacitance C of the input terminal is 30 pF and the resistance value R of the feedback resistors is 1 MΩ, then the time constant $\tau$ (30 µs) is $\tau = R$ (1 M)×C (30 pF). This is approximately equal to actual oscillation starting time. Although Patent Document 2 states that start-up occurs immediately after the trigger pulse is removed, removal of the trigger pulse is actually followed by bias stabilization time for a while. In other words, with removal of the pulse following the introduction of power, bias stabilization time is required again after bias stabilizes. Furthermore, since the oscillation circuit described in Patent Document 2 generates the trigger pulse upon detecting the rising edge of power supply voltage, an oscillation circuit that operates in the standby mode cannot be constructed, which offers a drawback, too. Accordingly there is much to be desired in the art.

According to one aspect of the present invention, there is provided an oscillation circuit comprising: an amplifier to an input and output of which a piezoelectric oscillator and a feedback resistor are connected in parallel, and which is constituted by a CMOS logic inverter circuit; and a control circuit, which is constituted by a CMOS logic circuit, for clamping input/output levels of the amplifier and halting oscillation before oscillation start-up, and unclamping the input/output levels at beginning of oscillation start-up to supply a pulse signal to an output terminal of the amplifier a prescribed period of time after the beginning of oscillation start-up.

According to a second aspect of the present invention, there is provided a method of controlling an oscillation circuit having an amplifier to an input and output of which a piezoelectric oscillator and a feedback resistor are connected in parallel, and which is constituted by a CMOS logic inverting circuit. The method comprises: supplying power to the amplifier and clamping input/output levels of the amplifier to thereby halt oscillation before oscillation start-up; unclamping input/output levels at beginning of oscillation start-up; and supplying a pulse signal to an output terminal of the amplifier a prescribed period of time after the beginning of oscillation start-up.

The meritorious effects of the present invention are summarized as follows.

An oscillation circuit in accordance with the present invention is capable of operating in the standby mode and current consumption relating to oscillation of the circuit can be suppressed by shortening oscillation start-up time.

Other features and advantages of the present invention will be apparent from the following description taken in conjunction with the accompanying drawings, in which like reference characters designate the same or similar parts throughout the figures thereof.

PREFERRED MODES

Figure 1:
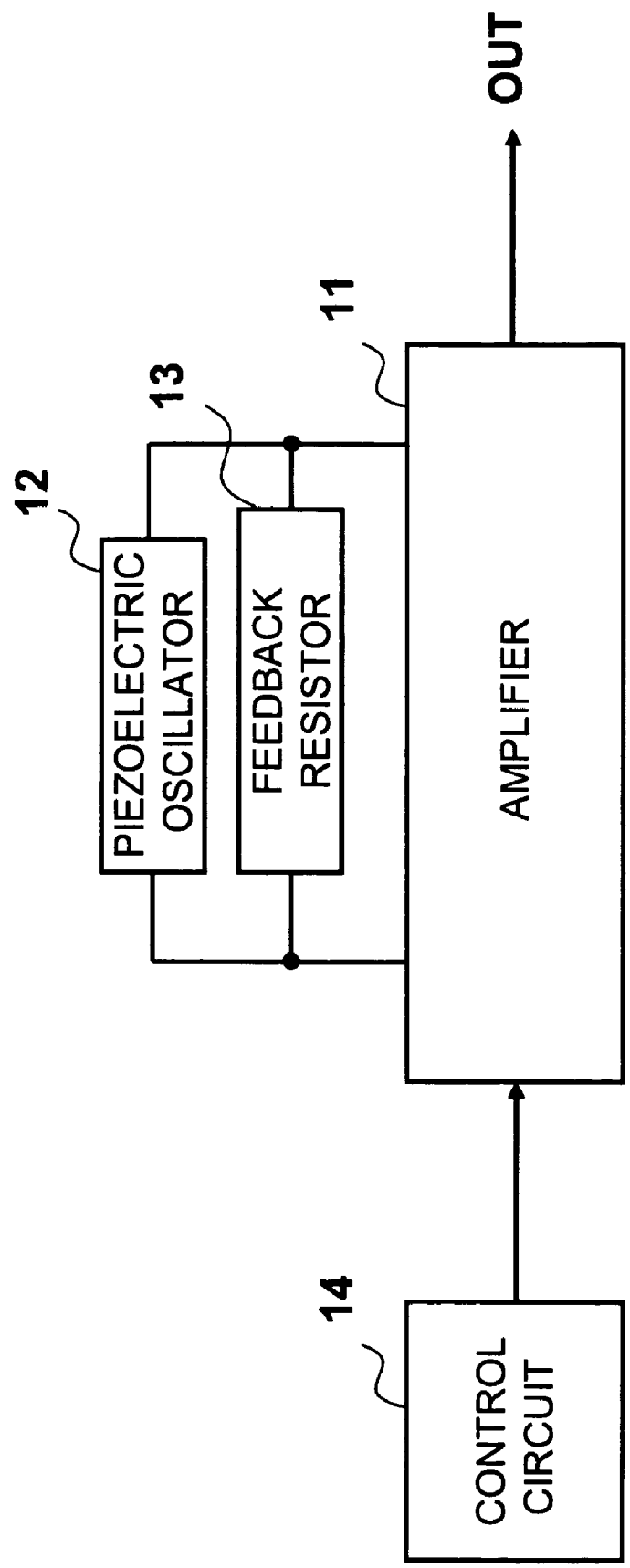
FIG. 1 is a diagram illustrating a general configuration of an oscillation circuit according to the present invention.

FIG. 1 is a diagram illustrating a general configuration of an oscillation circuit according to the present invention. As shown in FIG. 1, the oscillation circuit comprises: an amplifier 11 to an input and output of which a piezoelectric oscillator 12 and a feedback resistor 13 are connected in parallel, and which is constituted by a CMOS logic inverting circuit; and a control circuit 14, which is constituted by a CMOS logic circuit, for clamping input/output levels of the amplifier 11 and halting oscillation before oscillation start-up, and unclamping the input/output levels at beginning of oscillation start-up to supply a pulse signal to an output terminal of the amplifier 11 a prescribed period of time after the beginning of oscillation start-up.

In the oscillation circuit of the present invention, the amplifier may be constituted by an inverter circuit and includes a first switch element connected to an input terminal of the inverter circuit; and a second switch element connected in series with the feedback resistor and, together with the feedback resistor, in parallel with the piezoelectric oscillator. Before oscillation start-up, the control circuit may clamp the input terminal of the inverter circuit at the high or low level by the first switch element, and place the second switch element in the OFF state; and at the beginning of oscillation start-up, the control circuit may unclamp the input terminal of the inverter circuit, and may place the second switch element in the ON state.

In the oscillation circuit of the present invention, the amplifier may be constituted by a 2-input NAND gate; a first end of the piezoelectric oscillator and a first end of the feedback resistor may be connected to a first input terminal of the NAND gate; and the control circuit places a second input terminal of the NAND gate at the low level before oscillation start-up, and places the second input terminal of the NAND gate at the high level at the beginning of oscillation start-up.

In the oscillation circuit of the present invention, the amplifier may be constituted by a 2-input NOR gate; a first end of the piezoelectric oscillator and a first end of the feedback resistor may be connected to a first input terminal of the NOR gate; and the control circuit may place a second input terminal of the NOR gate at the high level before oscillation start-up, and place the second input terminal of the NOR gate at the low level at the beginning of oscillation start-up.

In the oscillation circuit of the present invention, the amplifier may be constituted by a clocked inverter circuit; before oscillation start-up, the control circuit may set the level of a clock terminal of the clocked inverter in such a manner that the clocked inverter circuit will not function as an inverter circuit; and at the beginning of oscillation start-up, the control circuit may set the level of the clock terminal of the clocked inverter in such a manner that the clocked inverter circuit will function as an inverter circuit.

In the oscillation circuit of the present invention, the amplifier may include first and second transistors of a first conductivity type and a transistor of a second conductivity type. The first transistor of the first conductivity type may have a source connected to a first power source, a drain connected to a source of the second transistor of the first conductivity type and a gate serving as a control terminal of the amplifier; the second transistor of the first conductivity type has a drain connected to a drain of the transistor of the second conductivity type and serving as the output terminal of the amplifier, and a gate serving as an input terminal of the amplifier. The transistor of the second conductivity type may have a source connected to a second power source and a gate serving as an input terminal of the amplifier. The control circuit may set the control terminal of the amplifier to a potential on the side of the first power source before oscillation start-up, and may set the control terminal of the amplifier to a potential on the side of the second power source at the beginning of oscillation start-up.

According to a further aspect of the present invention, a portable electronic device may comprise the above-described oscillation circuit and a battery for supplying the oscillation circuit with power.

In accordance with the oscillation circuit described above, a standby state in which the input/output levels of the amplifier are clamped to halt oscillation is established before oscillation is started up. At the beginning of oscillation start-up, the input/output levels are unclamped and, a prescribed time after the beginning of oscillation start-up, a pulse signal is supplied to the output terminal of the amplifier so that the oscillating operation can be accelerated. This makes it possible to suppress the consumption of current in the oscillation circuit.

Exemplary Embodiments of the present invention will now be described in detail with reference to the drawings.

First Exemplary Embodiment

Figure 2:
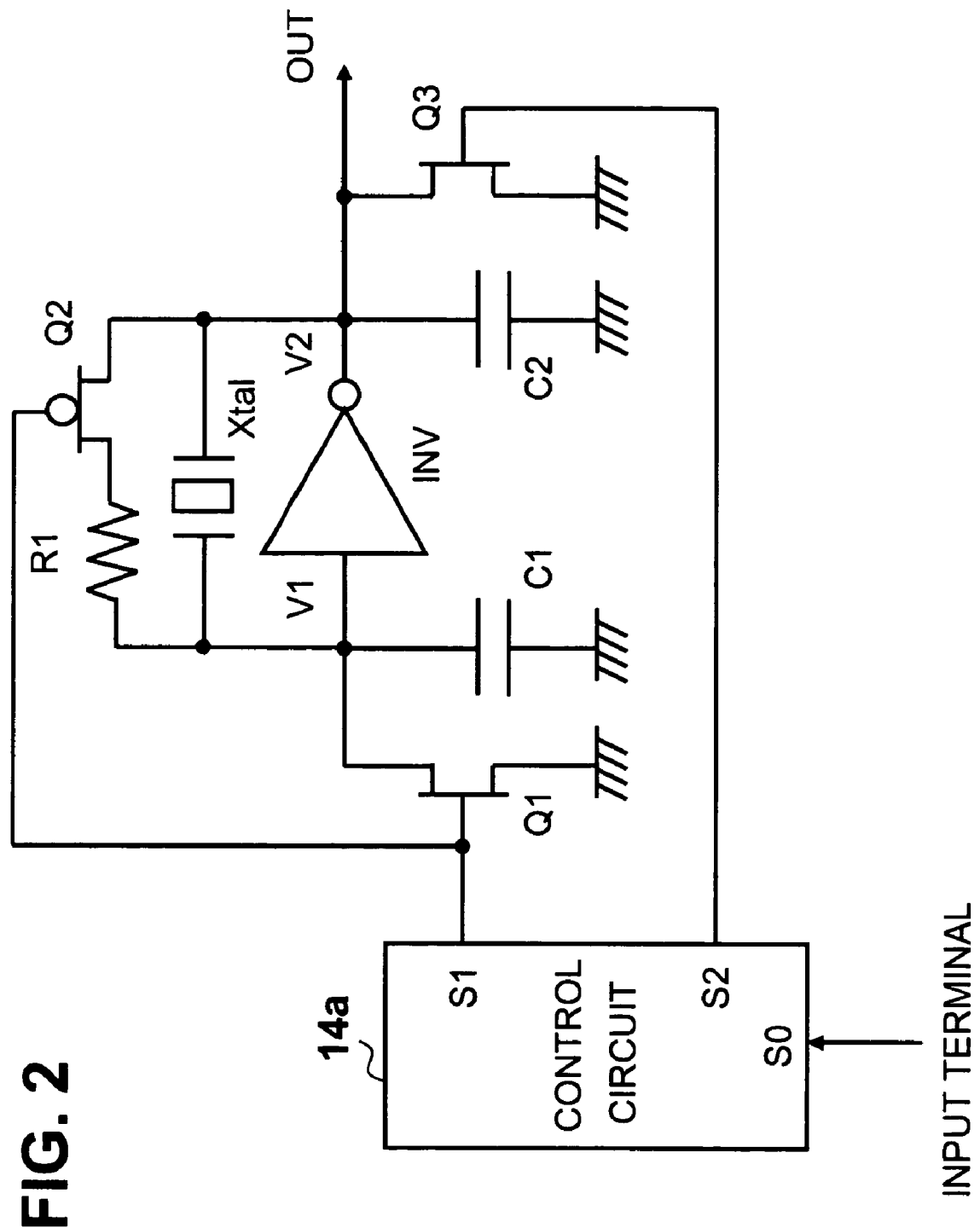
FIG. 2 is a circuit diagram of an oscillation circuit according to a first exemplary embodiment of the present invention.

FIG. 2 is a circuit diagram of an oscillation circuit according to a first exemplary embodiment of the present invention. As shown in FIG. 2, the oscillation circuit includes a CMOS-configured inverter circuit INV, a crystal oscillator Xtal, a resistor R1, capacitors C1, C2, NMOS transistors Q1 Q3, a PMOS transistor Q2 and a CMOS-configured control circuit 14a.

The inverter circuit INV functions as an amplifier and has an input terminal to which are connected a first end of the capacitor C1, the drain of the NMOS transistor Q1, a first end of the crystal oscillator Xtal and a first end of the resistor R1, and an output terminal to which are connected a first end of the capacitor C2, the drain of the NMOS transistor Q3, a second end of the crystal oscillator Xtal and a first end of the PMOS transistor Q2. The second end of the PMOS transistor Q2 and the second end of the resistor R1 are connected to each other. The second end of the capacitor C1, the source of the NMOS transistor Q1, the second end of the capacitor C2 and the source of the NMOS transistor Q3 are all grounded.

The control circuit 14a, which is constituted by a CMOS logic circuit, has terminals S0, S1 and S2. A signal for starting the oscillation circuit is input to the terminal S0, the terminal S1 is connected to the gate of the NMOS transistor Q1 and to the gate of the PMOS transistor Q2, and the terminal S2 is connected to the gate of the NMOS transistor Q3. If the terminal S0 rises from the L to the H level, the control circuit 14a immediately sends the terminal S1 from the H to the L level and, upon elapse of a prescribed period of time, raises the terminal S2 to the H level for a fixed period of time. A one-shot circuit, for example, is incorporated in order to control the pulse signal that is output from the terminal S2.

Figure 3:
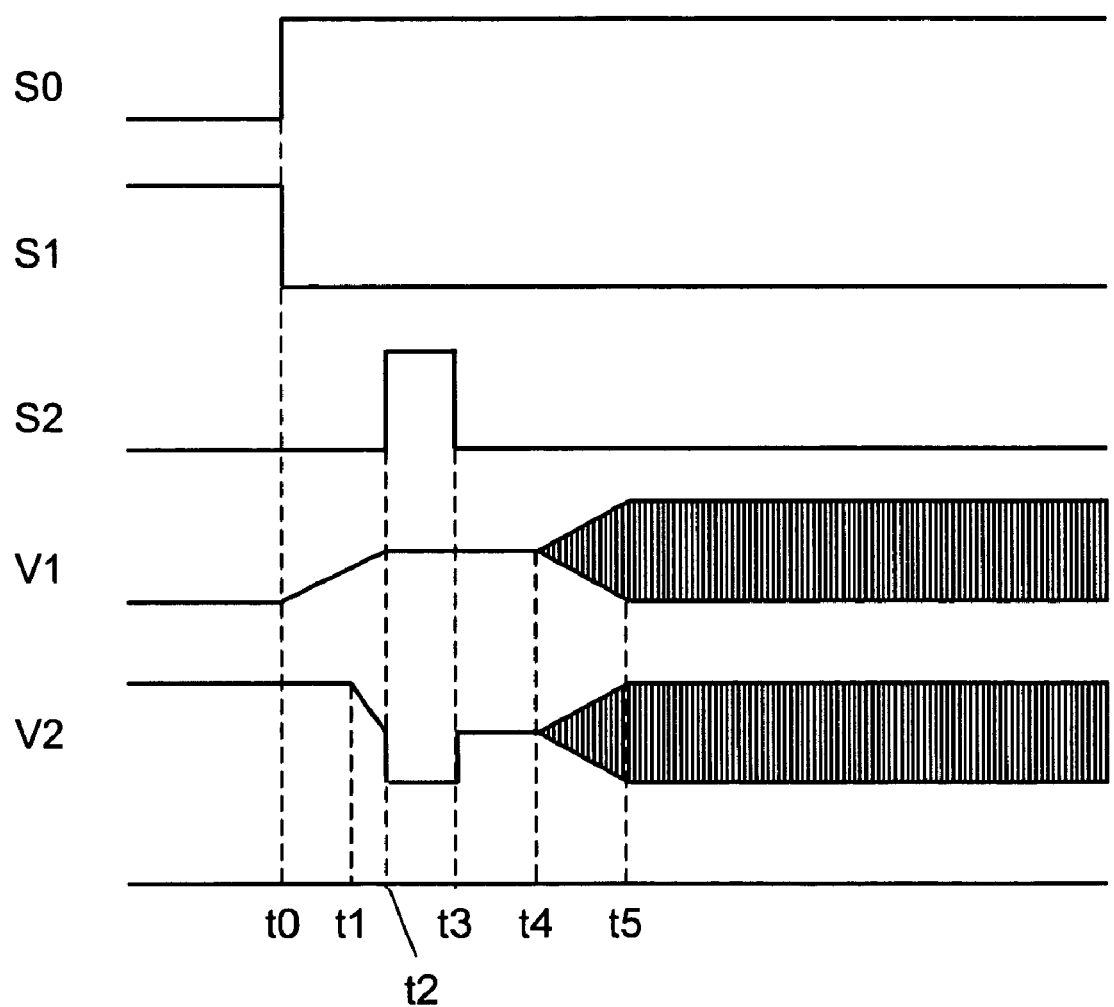
FIG. 3 is a timing chart representing operation of the oscillation circuit according to the first exemplary embodiment.

Operation of the oscillation circuit will be described next. FIG. 3 is a timing chart representing operation of the oscillation circuit according to the first exemplary embodiment of the present invention. In FIG. 3, the period up to time t0, which is the time at which the start-up signal of the oscillation circuit is input, corresponds to the standby mode. In this state the terminal S0 is at the L level, the terminal S1 is at the H level and the terminal S2 is at the L level. Accordingly, the NMOS transistor Q1 is in the ON state, the PMOS transistor Q2 is in the OFF state and the NMOS transistor Q3 is in the OFF state. As a consequence, an input voltage V1 of the inverter circuit INV is clamped at the L level and an output voltage V2 thereof is clamped at the H level. Since the PMOS transistor Q2 is in the OFF state, no current flows from the output terminal (OUT) of the inverter circuit INV to the ON NMOS transistor Q1 via the resistor R1. Almost no power supply current flows in the standby mode as long as the inverter circuit INV and control circuit 14a are implemented by CMOS.

At time t0, the H level is input to the terminal S0 as the start-up signal of the oscillation circuit, whereupon the control circuit 14a places the terminal S1 at the L level. Accordingly, the NMOS transistor Q1 turns off, the PMOS transistor Q2 turns on and a current flows from the output terminal (OUT) of the inverter circuit INV to the side of the input terminal of the inverter circuit INV via the resistor R1, thereby charging the capacitor C1. As a result, the input voltage V1 of the inverter circuit INV rises gradually from the L to the H level.

When the input voltage V1 reaches the vicinity of potential intermediate the power source and ground at time t1, the inverter circuit INV functions as an inverting amplifier and the output voltage V2 falls toward the intermediate potential.

At time t2 a prescribed period of time after time t0, the control circuit 14a places the terminal S2 at the H level and holds it at this level until time t3. The time t2 is that at which the output voltage V2 attains a potential approximately intermediate the power source and ground. The NMOS transistor Q3 turns on and the output voltage V2 falls to the L level. Although the input voltage V1 attempts to head toward the L level via the resistor R1 as a result, the input voltage V1 remains at the intermediate potential without immediately falling to the L level because the resistance value of the resistor R1 is high.

When a time t3, which corresponds to the width (t3−t2) of the trigger pulse, arrives, the control circuit 14a returns the terminal S2 to the L level. The NMOS transistor Q3 turns off and the output voltage V2 returns to the intermediate potential since the input voltage V1 is at the intermediate potential.

Owing to application of the trigger pulse, which places the output of the inverter circuit INV at the L level, the start of oscillation is accelerated at time t4 and oscillation attains the steady state at time t5. The oscillating signal is output from the output OUT to the exterior of the oscillation circuit.

In the description rendered above, the input voltage V1 of the inverter circuit INV is clamped at the L level by the ON NMOS transistor Q1 up to time t0. However, it may be so arranged that the input voltage V1 is clamped at the H level by other means. In this case the output voltage V2 would be clamped at the L level and, at time t1, would rise toward the intermediate potential.

In accordance with the above-described oscillation circuit constituted by the inverter circuit INV, the input and output levels of the inverter circuit INV are clamped before the start of oscillation, thereby halting oscillation and making current consumption substantially zero. Furthermore, the oscillating operation can be accelerated by supplying a pulse signal (trigger pulse) to the output terminal of the inverter circuit INV a prescribed period of time after oscillation start-up begins. Accordingly, start-up of the oscillation circuit is shortened and current consumption relating to oscillation start-up can be suppressed.

Second Exemplary Embodiment

Figure 4:
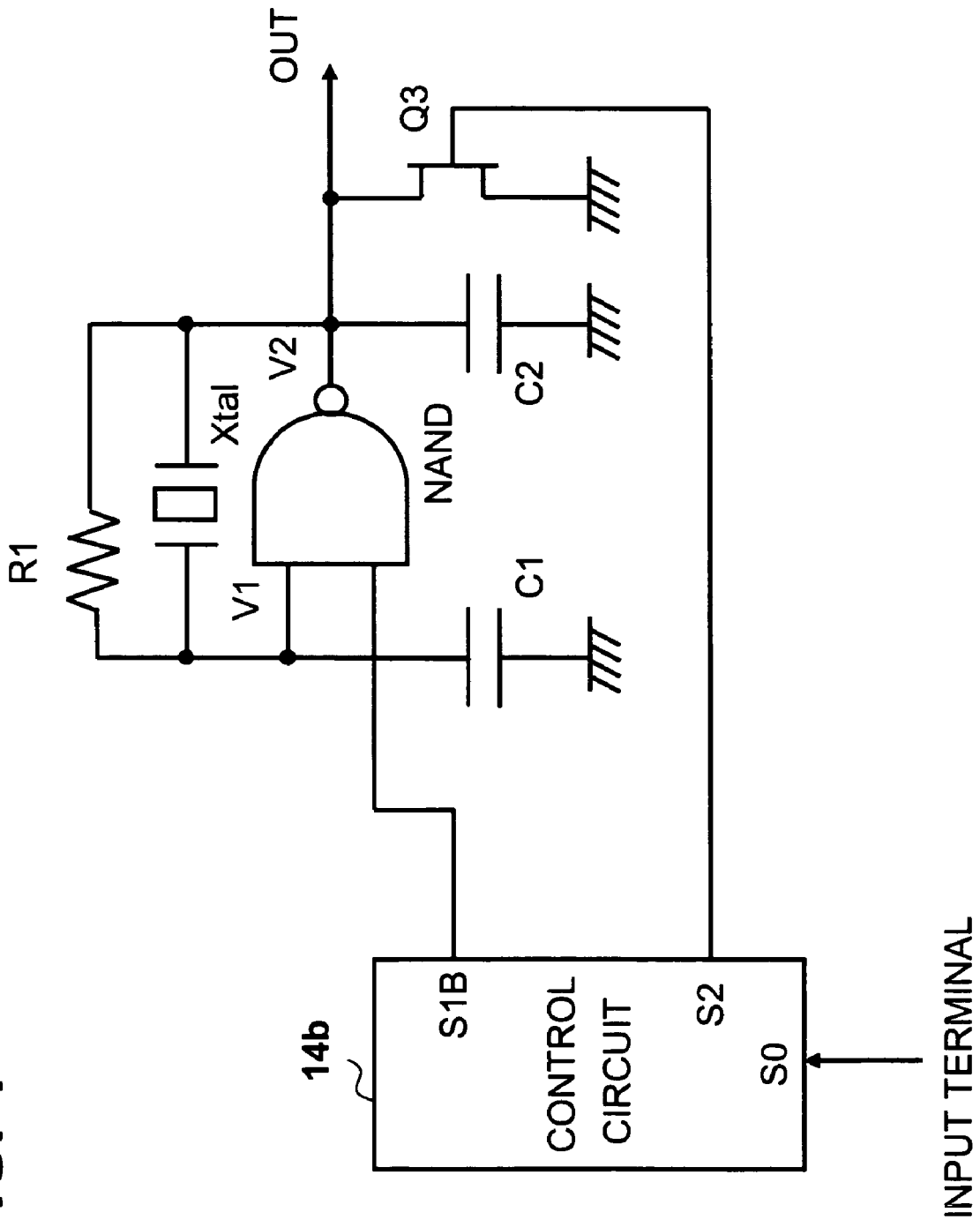
FIG. 4 is a circuit diagram of an oscillation circuit according to a second exemplary embodiment of the present invention.

FIG. 4 is a circuit diagram of an oscillation circuit according to a second exemplary embodiment of the present invention. Components in FIG. 4 identical with those in FIG. 2 are designated by like reference characters and need not be described again. The oscillation circuit according to the second exemplary embodiment differs from the oscillation circuit of FIG. 2 in that the NMOS transistor Q1 and PMOS transistor Q2 are eliminated and a 2-input NAND gate NAND is provided in place of the inverter circuit INV. Further, the control circuit 14b has a terminal SIB. A signal that is opposite in phase to the signal that is output from the terminal S1 of FIG. 2 is output from the terminal SIB to the first input terminal of the NAND gate NAND. The first end of the resistor R1, the first end of the capacitor C1 and the first end of the crystal oscillator Xtal are connected to the second input terminal of the NAND gate NAND. Further, the first end of the capacitor C2, the second end of the crystal oscillator Xtal, the second end of the resistor R1 and the drain of the NMOS transistor Q3 are connected to the output terminal of the NAND gate NAND.

Figure 5:
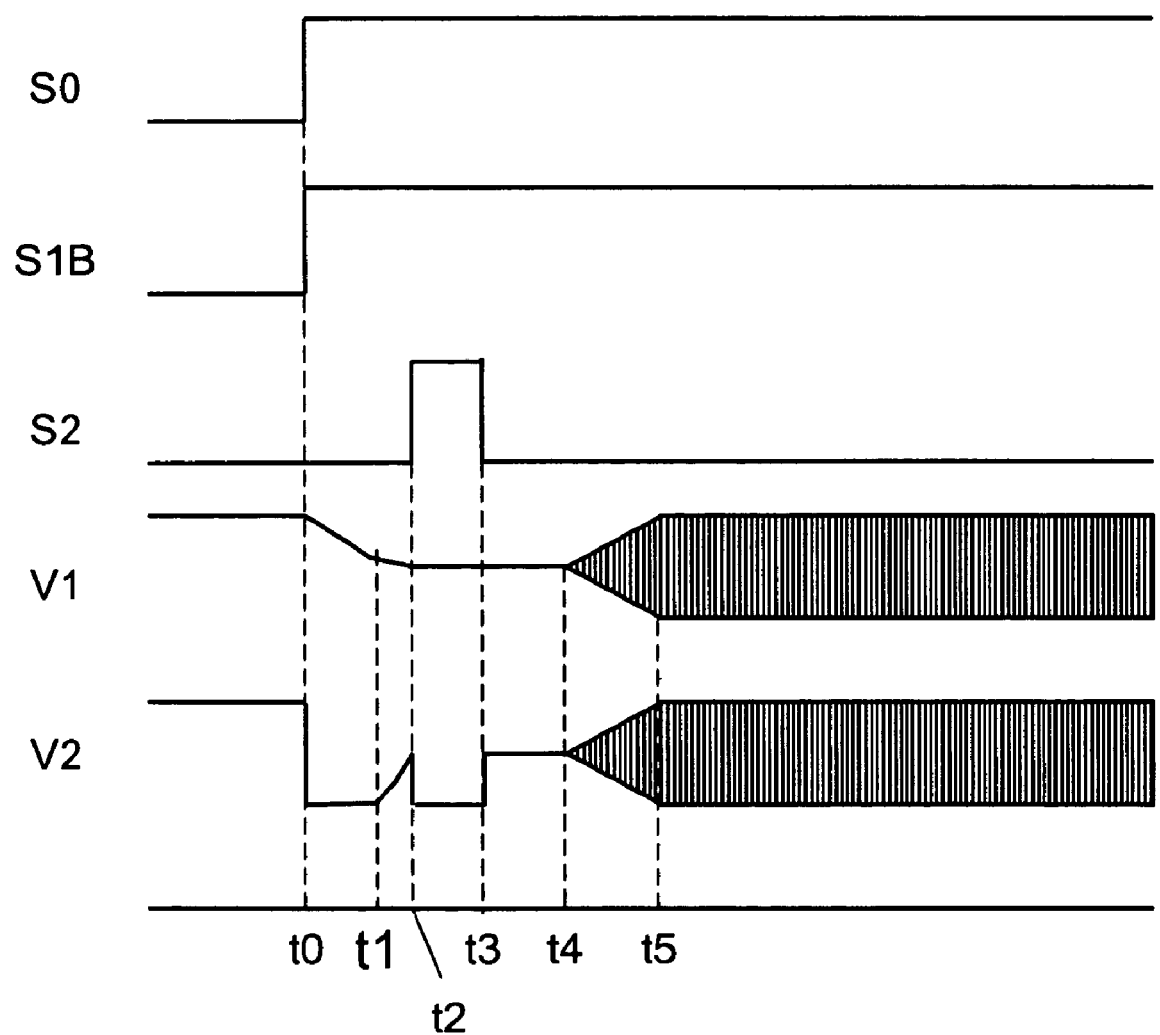
FIG. 5 is a timing chart representing operation of the oscillation circuit according to the second exemplary embodiment.

Operation of the oscillation circuit will be described next. FIG. 5 is a timing chart representing operation of the oscillation circuit according to the second exemplary embodiment of the present invention. In FIG. 5, the period up to time t0, which is the time at which the start-up signal of the oscillation circuit is input, corresponds to the standby mode. In this state the terminals S0, S1B and S2 are all at the L level. Accordingly, the NMOS transistor Q3 is in the OFF state and the output OUT (output voltage V2) of the NAND gate NAND is clamped at the H level. The second input terminal (input voltage V1) of the NAND gate NAND, therefore, is clamped at the H level by the voltage that arrives via the intermediary of the resistor R1. Almost no power supply current flows in the standby mode as long as the NAND gate NAND and control circuit 14b are implemented by CMOS.

At time t0, the H level is input to the terminal S0 as the start-up signal of the oscillation circuit, whereupon the control circuit 14b places the terminal S1B at the H level. Accordingly, the output OUT (output voltage V2) of the NAND gate NAND falls to the L level rapidly. This is accompanied by the second input terminal (input voltage V1) of the NAND gate NAND slowly falling toward the L level via the resistor R1.

When the input voltage V1 reaches the vicinity of potential intermediate the power source and ground at time t1, the NAND gate NAND functions as an inverting amplifier and the output voltage V2 rises toward the intermediate potential.

At time t2 a prescribed period of time after time t0, the control circuit 14b places the terminal S2 at the H level and holds it at this level until time t3. The time t2 is that at which the output voltage V2 attains a potential approximately intermediate the power source and ground. The NMOS transistor Q3 turns on and the output voltage V2 falls to the L level. Although the input voltage V1 attempts to fall toward the L level via the resistor R1 as a result, the input voltage V1 remains at the intermediate potential without immediately falling to the L level because the resistance value of the resistor R1 is high.

When a time t3, which corresponds to the width (t3−t2) of the trigger pulse, arrives, the control circuit 14b returns the terminal S2 to the L level. The NMOS transistor Q3 turns off and the output voltage V2 returns to the intermediate potential since the input voltage V1 is at the intermediate potential.

Owing to application of the trigger pulse, which places the output of the NAND gate NAND at the L level, the start of oscillation is accelerated at time t4 and oscillation attains the steady state at time t5.

In accordance with the above-described oscillation circuit constituted by the NAND gate NAND, current consumption is made substantially zero in the standby mode in a manner similar to that of the first exemplary embodiment. Furthermore, current consumption relating to oscillation start-up can be suppressed.

Third Exemplary Embodiment

Figure 6:
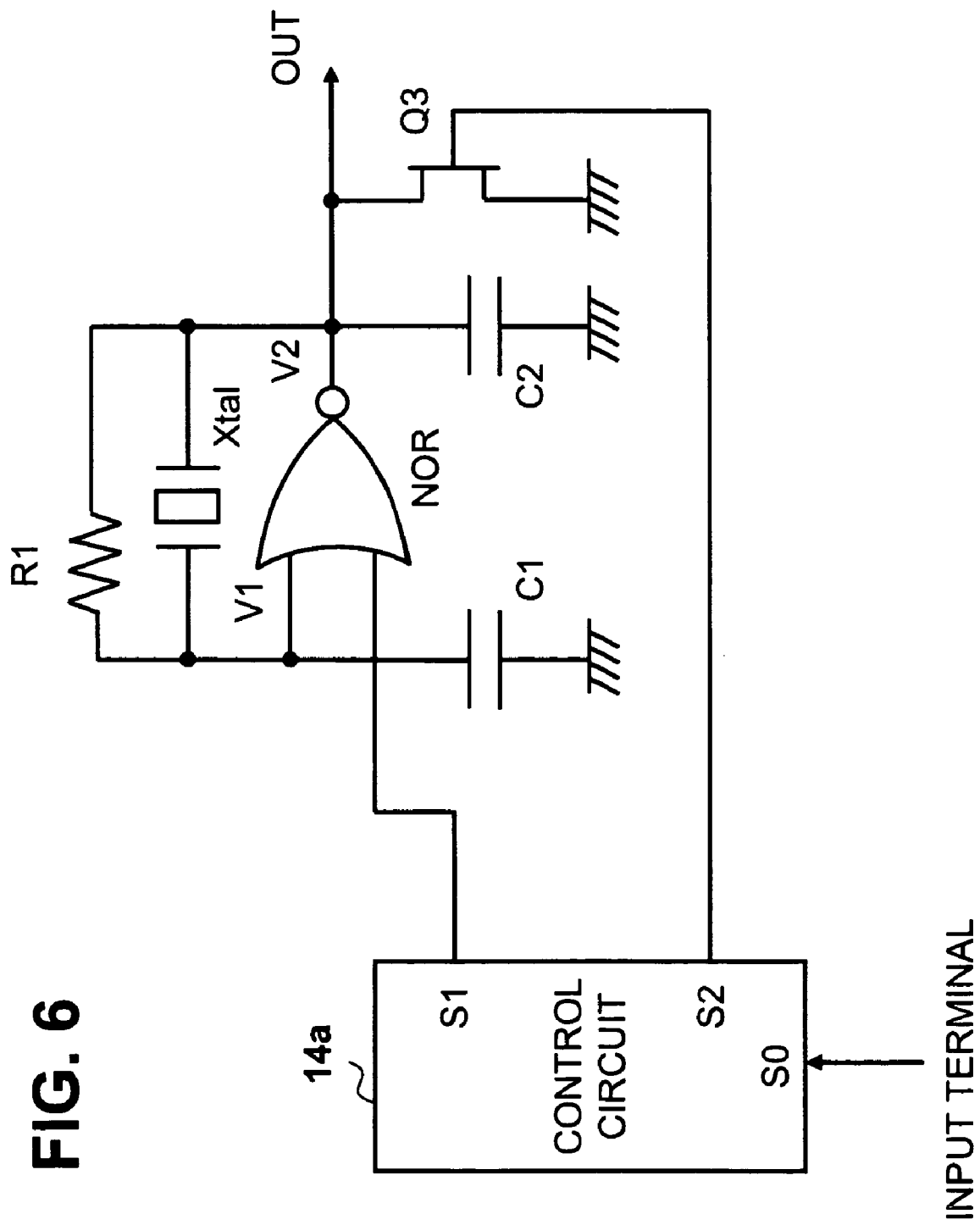
FIG. 6 is a circuit diagram of an oscillation circuit according to a third exemplary embodiment of the present invention.

FIG. 6 is a circuit diagram of an oscillation circuit according to a third exemplary embodiment of the present invention. Components in FIG. 6 identical with those in FIG. 2 are designated by like reference characters and need not be described again. The oscillation circuit according to the third exemplary embodiment differs from the oscillation circuit of FIG. 2 in that the NMOS transistor Q1 and PMOS transistor Q2 are eliminated and a 2-input NOR gate NOR is provided in place of the inverter circuit INV. The terminal S1 is connected to the first input terminal of the NOR gate NOR. The first end of the resistor R1, the first end of the capacitor C1 and the first end of the crystal oscillator Xtal are connected to the second input terminal of the NOR gate NOR. Further, the first end of the capacitor C2, the second end of the crystal oscillator Xtal, the second end of the resistor R1 and the drain of the NMOS transistor Q3 are connected to the output terminal of the NOR gate NOR.

Operation of the oscillation circuit will be described next. The timing chart representing the operation of the oscillation circuit according to the third exemplary embodiment is similar to that of FIG. 3 with the exception of the standby mode in effect up to time to. In the standby mode up to time t0, the NMOS transistor Q3 is in the OFF state and the H level is applied to the first input terminal of the NOR gate NOR from the terminal S1, as a result of which the output OUT (output voltage V2) of the NOR gate NOR is clamped at the L level. Accordingly, the second input terminal (input voltage V1) of the NOR gate NOR is clamped at the L level by the voltage that arrives via the intermediary of the resistor R1.

At time t0, the H level is input to the terminal S0 as the start-up signal of the oscillation circuit, whereupon the control circuit 14a places the terminal S1 at the H level. Accordingly, the output OUT (output voltage V2) of the NOR gate NOR rises to the H level rapidly. This is accompanied by the second input terminal (input voltage V1) of the NOR gate NOR slowly rising toward the H level via the resistor R1.

Operation is similar to that of the oscillation circuit of the first exemplary embodiment from time t1 onward.

Fourth Exemplary Embodiment

Figure 7:
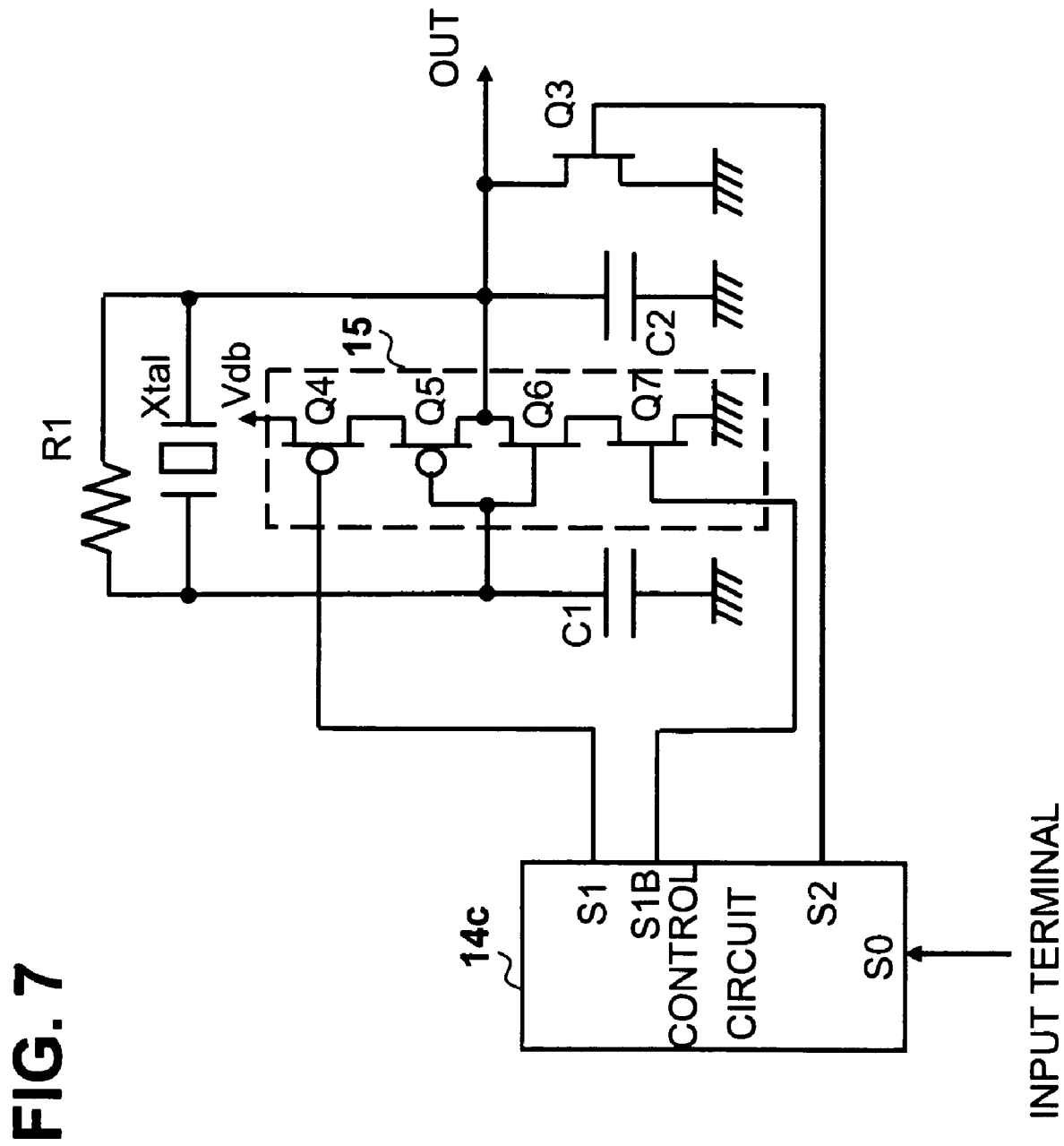
FIG. 7 is a circuit diagram of an oscillation circuit according to a fourth exemplary embodiment of the present invention.

FIG. 7 is a circuit diagram of an oscillation circuit according to a fourth exemplary embodiment of the present invention. Components in FIG. 7 identical with those in FIG. 2 are designated by like reference characters and need not be described again. The oscillation circuit according to the fourth exemplary embodiment differs from the oscillation circuit of FIG. 2 in that the NMOS transistor Q1 and PMOS transistor Q2 are eliminated and a clocked inverter circuit 15 is provided in place of the inverter circuit INV. The clocked inverter circuit 15 has PMOS transistors Q4, Q5 and NMOS transistors Q6, Q7. The PMOS transistor Q4 has a source connected to a power source Vdd, a drain connected to the source of the PMOS transistor Q5 and a gate connected to the terminal S1. The PMOS transistor Q5 has a drain connected to the drain of the NMOS transistor Q6 and to the output terminal (OUT) of the clocked inverter circuit 15, and a gate connected to the gate of the NMOS transistor Q6 and to the input terminal of the clocked inverter circuit 15. The NMOS transistor Q6 has a source connected to the drain of the NMOS transistor Q7. The NMOS transistor Q7 has a source connected to ground and a gate connected to the terminal S1B. A control circuit 14c has terminals S1, S1B that output signals which are opposite in phase.

Operation of the oscillation circuit will be described next. The timing chart representing the operation of the oscillation circuit according to the fourth exemplary embodiment is similar to that of FIG. 3 from time t2 onward.

In the standby mode in effect up to time t0, the terminals S1 and S1B are at the H and L levels, respectively. Accordingly, the PMOS transistor Q4 and NMOS transistor Q7 are both in the OFF state and the clocked inverter circuit 15 is inactive, with its input and output terminals in the floating state.

When the H level is input to the terminal S0 as the start-up signal of the oscillation circuit at time t0, the control circuit 14c places the terminals S1 and S1B at the L and H levels, respectively. Accordingly, the PMOS transistor Q4 and NMOS transistor Q7 both turn on and the clocked inverter circuit 15 operates as an inverting amplifier, the input and output terminals of which attain a potential intermediate the power source and ground (at time t1).

Operation is similar to that of the oscillation circuit of the first exemplary embodiment from time t2 onward.

Fifth Exemplary Embodiment

Figure 8:
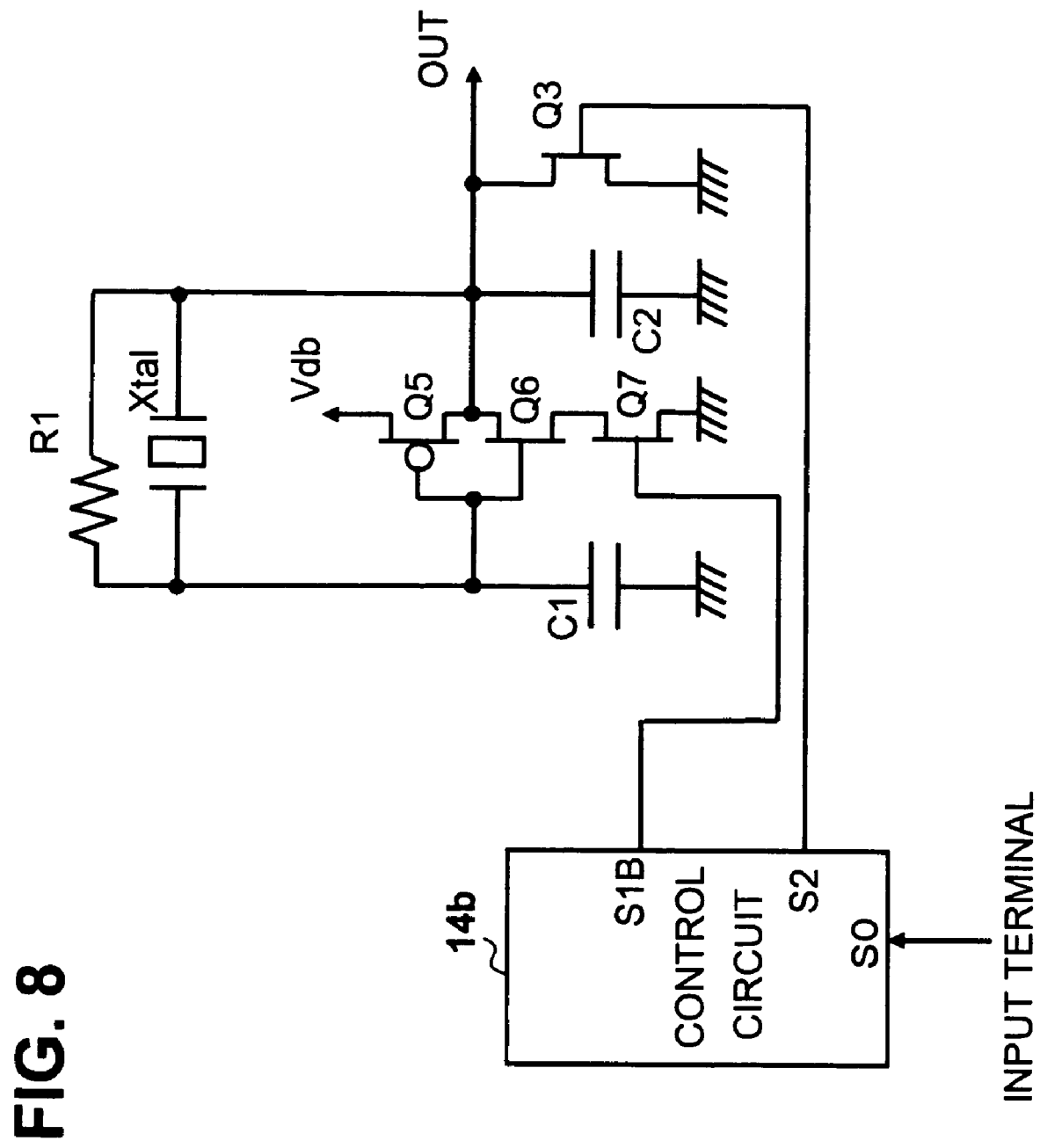
FIG. 8 is a circuit diagram of an oscillation circuit according to a fifth exemplary embodiment of the present invention.

FIG. 8 is a circuit diagram of an oscillation circuit according to a fifth exemplary embodiment of the present invention. Components in FIG. 8 identical with those in FIG. 7 are designated by like reference characters and need not be described again. The oscillation circuit according to the fifth exemplary embodiment differs from the oscillation circuit of FIG. 7 in that the PMOS transistor Q4 is eliminated and this portion of the circuit is short-circuited, and in that the terminal S1 also is eliminated.

Operation of the oscillation circuit will be described next. The timing chart representing the operation of the oscillation circuit according to the fifth exemplary embodiment is similar to that of FIG. 3 from time t2 onward.

In the standby mode in effect up to time t0, the terminal S1B is at the L level. Accordingly, the NMOS transistor Q7 is in the OFF state and an inverter circuit, which is constituted by the PMOS transistor Q5 and NMOS transistor Q6, is inactive, with its input and output terminals in the floating state.

When the H level is input to the terminal S0 as the start-up signal of the oscillation circuit at time t0, the control circuit 14b places the terminal SIB at the H level. Accordingly, the NMOS transistor Q7 turns on and the inverter circuit 15, which is constituted by the PMOS transistor Q5 and NMOS transistor Q6, operates as an inverting amplifier, the input and output terminals of which attain a potential intermediate the power source and ground (at time t1).

Operation is similar to that of the oscillation circuit of the first exemplary embodiment from time t2 onward.

Sixth Exemplary Embodiment

Figure 9:
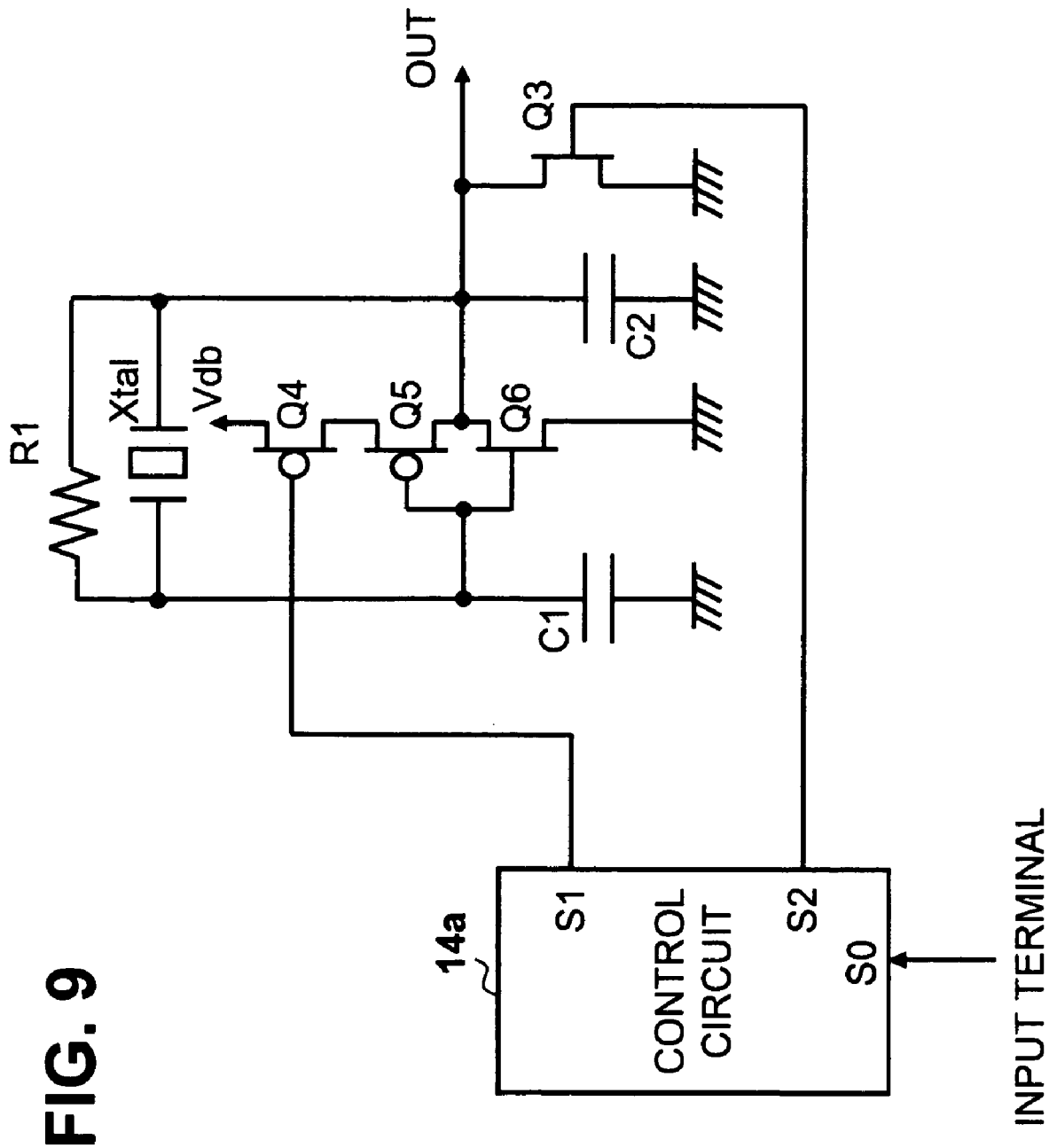
FIG. 9 is a circuit diagram of an oscillation circuit according to a sixth exemplary embodiment of the present invention.

FIG. 9 is a circuit diagram of an oscillation circuit according to a sixth exemplary embodiment of the present invention. Components in FIG. 9 identical with those in FIG. 7 are designated by like reference characters and need not be described again. The oscillation circuit according to the sixth exemplary embodiment differs from the oscillation circuit of FIG. 7 in that the NMOS transistor Q7 is eliminated and this portion of the circuit is short-circuited, and in that the terminal S1B also is eliminated.

Operation of the oscillation circuit will be described next. The timing chart representing the operation of the oscillation circuit according to the sixth exemplary embodiment is similar to that of FIG. 3 from time t2 onward.

In the standby mode in effect up to time t0, the terminal S1 is at the H level. Accordingly, the PMOS transistor Q4 is in the OFF state and the inverter circuit, which is constituted by the PMOS transistor Q5 and NMOS transistor Q6, is inactive, with its input and output terminals in the floating state.

When the H level is input to the terminal S0 as the start-up signal of the oscillation circuit at time t0, the control circuit 14a places the terminal S1 at the L level. Accordingly, the PMOS transistor Q4 turns on and the inverter circuit 15, which is constituted by the PMOS transistor Q5 and NMOS transistor Q6, operates as an inverting amplifier, the input and output terminals of which attain a potential intermediate the power source and ground (at time t1).

Operation is similar to that of the oscillation circuit of the first exemplary embodiment from time t2 onward.

In each of the foregoing exemplary embodiments, it is described that a trigger pulse that falls to the L level is supplied to the output terminal of the amplifier by turning on the NMOS transistor Q3. However, the invention is not limited to this arrangement. Instead, means for supplying the output terminal of the amplifier with a trigger pulse that attains the H level may be provided to accelerate the start of oscillation.

The disclosures of the patent documents cited above are incorporated by reference in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An oscillation circuit, comprising:
   an amplifier comprising a CMOS logic inverter circuit, said amplifier having an input terminal and an output terminal;
   a piezoelectric oscillator and a feedback resistor interconnected in a parallel manner, a first terminal of said piezoelectric oscillator connected to said amplifier input terminal and a second terminal of said piezoelectric oscillator connected to said amplifier output terminal; and
   a control circuit, comprising a CMOS logic circuit, for:
      clamping input level of said amplifier and an output level of said amplifier, thereby halting an oscillation before an oscillation start-up signal has been received as an external input signal to said control circuit;
      unclamping the input and output levels at a beginning of an oscillation start-up, upon receiving said oscillation start-up signal; and
      supplying a pulse signal to an output terminal of said amplifier a prescribed period of time after the beginning of the oscillation start-up.

2. The circuit according to claim 1, wherein said amplifier comprises an inverter circuit and further includes:
   a first switch element connected to the input terminal of said inverter circuit; and
   a second switch element connected in series with the feedback resistor and, together with the feedback resistor, in parallel with the piezoelectric oscillator; and
   wherein:
      before the oscillation start-up, said control circuit clamps the input terminal of said inverter circuit at the high or low level by said first switch element and places said second switch element in an OFF state; and
      at the beginning of the oscillation start-up, said control circuit unclamps the input terminal of said inverter circuit and places said second switch element in the ON state.

3. The circuit according to claim 1, wherein:
said amplifier comprises a 2-input NAND gate;
a first end of the piezoelectric oscillator and a first end of the feedback resistor are connected to a first input terminal of the NAND gate; and
said control circuit places a second input terminal of the NAND gate at the low level before the oscillation start-up, and places the second input terminal of the NAND gate at a high level at the beginning of the oscillation start-up.

4. The circuit according to claim 1, wherein:
said amplifier comprises a 2-input NOR gate;
a first end of the piezoelectric oscillator and a first end of the feedback resistor are connected to a first input terminal of the NOR gate; and
said control circuit places a second input terminal of the NOR gate at a high level before the oscillation start-up, and places the second input terminal of the NOR gate at a low level at the beginning of the oscillation start-up.

5. The circuit according to claim 1, wherein:
said amplifier is comprises a clocked inverter circuit;
before the oscillation start-up, said control circuit sets a level of a clock terminal of the clocked inverter in such a manner that the clocked inverter circuit is disabled; and
at the beginning of the oscillation start-up, said control circuit sets the level of the clock terminal of the clocked inverter in such a manner that the clocked inverter circuit will function as an inverter circuit.

6. The circuit according to claim 1, wherein:
said amplifier includes first and second transistors of a first conductivity type and a transistor of a second conductivity type;
said first transistor of the first conductivity type comprises a source connected to a first power source, a drain connected to a source of said second transistor of the first conductivity type, and a gate serving as a control terminal of said amplifier;
said second transistor of the first conductivity type comprises a drain connected to a drain of said transistor of the second conductivity type and serving as the output terminal of said amplifier, and a gate serving as the input terminal of said amplifier;
said transistor of the second conductivity type comprises a source connected to a second power source and a gate serving as the input terminal of said amplifier; and
said control circuit sets the control terminal of said amplifier to a potential on the side of the first power source before the oscillation start-up, and sets the control terminal of said amplifier to a potential on a side of the second power source at the beginning of the oscillation start-up.

7. A portable electronic device comprising:
the oscillation circuit set forth in claim 1; and
a battery for supplying said oscillation circuit with power.

8. A method of controlling an oscillation circuit including an amplifier comprising a CMOS logic inverter circuit, said amplifier having an input terminal and an output terminal, piezoelectric oscillator and a feedback resistor being connected in a parallel manner between the amplifier input terminal and the amplifier output terminal, said method comprising:
supplying power to the amplifier and clamping both an input level and an output level of the amplifier to thereby halt an oscillation before an oscillation start-up;
unclamping the input level and the output level at a beginning of the oscillation start-up upon receiving an input signal; and
supplying a pulse signal to the output terminal of the amplifier a prescribed period of time after the beginning of the oscillation start-up.

9. The method of claim 8, wherein said prescribed period of time after the beginning of the oscillation start-up corresponds to a timing in which said output level of said amplifier will have achieved a potential approximately midway between a power supply level and a ground potential.

10. The method of claim 8, wherein said prescribed period of time after the beginning of the oscillation start-up corresponds approximately to a timing in which said amplifier will change states.

11. The oscillation circuit of claim 1, wherein said prescribed period of time after the beginning of the oscillation start-up corresponds to a timing in which said output level of said amplifier will have achieved a potential approximately midway between a power supply level and a ground potential, and
wherein said prescribed period of time after the beginning of the oscillation start-up corresponds approximately to a timing in which said amplifier will change states.

12. The oscillation circuit of claim 1, wherein said control circuit comprises a transistor that selectively switches said output terminal of said amplifier to a fixed potential, said transistor being controlled by said control circuit so as to provide said pulse signal to said output terminal.

13. An oscillation circuit, comprising:
a CMOS (complementary metal oxide semiconductor) active device having at least one input terminal and an output terminal;
a piezoelectric oscillator interconnected between one of said at least one input terminal and said output terminal;
a first switch to selectively connect said output terminal to a ground potential; and
a CMOS control circuit, comprising:
a control circuit input terminal for receiving an oscillation startup signal;
a first control circuit output terminal; and
a second control circuit output terminal that controls said first switch,
wherein said CMOS control circuit:
if said control circuit input terminal is at a first state, said control circuit provides a signal at said first control circuit output terminal so as to clamp the input terminal of said CMOS active device to the ground potential and a signal at said second control circuit output terminal so as to clamp said output terminal of said CMOS active device to a positive voltage; and
when said control circuit input terminal is changed to a second state serving as said oscillation startup signal, said control circuit:
provides, substantially immediately, a signal to said first control circuit output terminal to unclamp the input terminal of said CMOS active device, thereby causing a voltage at said input terminal to begin to rise, due to the positive voltage at the output terminal being fed back to the input terminal; and
provides, after a prescribed period of time, a pulse signal to said second control circuit output terminal, during which pulse signal said first switch switches said output terminal of said CMOS active device to said ground potential, said pulse signal thereby accelerating an oscillation of said piezoelectric oscillator.

14. The oscillation circuit of claim 13, wherein said prescribed period of time after the beginning of the oscillation start-up corresponds to a timing in which said output level of said CMOS active will have achieved a potential approximately midway between a power supply level and a ground potential and approximately to a timing in which said CMOS active device will change states.

15. The oscillation circuit of claim 13, wherein said CMOS active device comprises an inverter, said oscillation circuit further comprising:
  a resistor having one terminal connected to an input terminal of the inverter;
  a PMOS switch serially interconnected between an output terminal of the inverter and the resistor; and
  a second switch selectively switching said inverter input terminal to said ground potential,
  wherein said PMOS switch and said second switch are controlled by the signal at said first control circuit output terminal.

16. The oscillation circuit of claim 13, wherein said CMOS active device comprises a NAND gate having a first input terminal connected to said first control circuit output terminal and a second input terminal connected to a terminal of said piezoelectric oscillator, said oscillation circuit further comprising a resistor connected in parallel with said piezoelectric oscillator.

17. The oscillation circuit of claim 13, wherein said CMOS active device comprises a NOR gate having a first input terminal connected to said first control circuit output terminal and a second input terminal connected to a terminal of said piezoelectric oscillator, said oscillation circuit further comprising a resistor connected in parallel with said piezoelectric oscillator.

18. An oscillation circuit, comprising:
  a CMOS (complementary metal oxide semiconductor) active device having at least one input terminal and an output terminal;
  a piezoelectric oscillator interconnected between one of said at least one input terminal and said output terminal;
  a first switch to selectively connect said output terminal to a ground potential; and
  a CMOS control circuit, comprising:
    a control circuit input terminal for receiving an oscillation startup signal;
    a first control circuit output terminal; and
    a second control circuit output terminal that controls said first switch,
  wherein said CMOS control circuit:
    if said control circuit input terminal is at a first state, said control circuit provides a signal at said first control circuit output terminal so that the input terminal of said CMOS active device is clamped to a non-operational floating state and a signal at said second control circuit output terminal so that the output terminal of said CMOS active device is clamped to said non-operational floating state; and
  when said control circuit input terminal is changed to a second state serving as said oscillation startup signal, said control circuit:
    provides, substantially immediately, a signal to said first control circuit output terminal to change the input terminal of said CMOS active device from said floating state, thereby causing a voltage at said input terminal to being to rise, due to a relative positive voltage at the output terminal being fed back to the input terminal after leaving said non-operational floating state; and
    provides, after a prescribed period of time, a pulse signal to said second control circuit output terminal, during which pulse signal said first switch switches said output terminal of said CMOS active device to said ground potential, said pulse signal thereby accelerating an oscillation of said piezoelectric oscillator,
  wherein said CMOS active device comprises a clocked inverter circuit having a first input terminal connected to said first control circuit output terminal and a second input terminal connected to a terminal of said piezoelectric oscillator, said oscillation circuit further comprising a resistor connected in parallel with said piezoelectric oscillator.

19. The oscillation circuit of claim 13, wherein said CMOS active device comprises a clocked inverter circuit having an NMOS clock transistor and a gate of said NMOS clock transistor is connected to said first control circuit output terminal and a second input terminal connected to a terminal of said piezoelectric oscillator, said oscillation circuit further comprising a resistor connected in parallel with said piezoelectric oscillator.

20. The oscillation circuit of claim 13, wherein said CMOS active device comprises a clocked inverter circuit having a PMOS clock transistor and a gate of said PMOS clock transistor is connected to said first control circuit output terminal and a second input terminal connected to a terminal of said piezoelectric oscillator, said oscillation circuit further comprising a resistor connected in parallel with said piezoelectric oscillator.

\* \* \* \* \*